United States Patent [19]
Kawano

[11] Patent Number: 5,477,809
[45] Date of Patent: Dec. 26, 1995

[54] METHOD OF GROWTH OF CDTE ON SILICON BY MOLECULAR BEAM EPITAXY

[75] Inventor: Masaya Kawano, Tokyo, Japan

[73] Assignee: NEC Corporation, Tokyo, Japan

[21] Appl. No.: 264,620

[22] Filed: Jun. 23, 1994

[30] Foreign Application Priority Data

Jun. 23, 1993 [JP] Japan ................................ 5-152041
Mar. 23, 1994 [JP] Japan ................................ 6-051590

[51] Int. Cl.$^6$ ............................................ C30B 25/02
[52] U.S. Cl. ........................... 117/108; 117/957; 437/105
[58] Field of Search ................................ 117/108, 956, 117/957; 437/105, 126

[56] References Cited

U.S. PATENT DOCUMENTS

5,306,386  4/1994  de Lyon ................................ 156/612
5,399,206  3/1995  de Lyon ................................ 148/334

OTHER PUBLICATIONS

By M. Kawano et al., "Twin-formation mechanisms for HgCdTe epilayers", *Journal of Crystal Growth*, 1992, vol. 117, pp. 171–176.
By R. Sporken et al., "Current status of direct growth of CdTe and HgCdTe on silicon by molecular–beam epitaxy", *J. Vac. Sci. Technology*, Jul./Aug. 1992, vol. 10, No. 4, pp. 1405–1409.
By T. de Lyon et al., "Direct molecular–beam epitaxial growth of ZnTe (100) and CdZnTe(100)/ZnTe(100) on Si(100) substrates", *Appl. Phys. Lett.*, Aug. 9, 1993, vol. 63, No. 6, pp. 818–820.
By. Y. Chen et al., "Structure of CdTe(111) B Grown by MBE on Misoriented Si(001)", *Journal of Electronic Materials*, 1993, vol. 22, No. 8, pp. 951–957.

*Primary Examiner*—R. Bruce Breneman
*Assistant Examiner*—Felisa Garrett
*Attorney, Agent, or Firm*—Young & Thompson

[57] ABSTRACT

The invention provides an epitaxial growth method of CdTe on silicon by molecular beam epitaxy in which a Si(221) tilted by 6° or less toward [−1 −1 4] is used, whose surface is rinsed in an ultra high vacuum for a subsequent epitaxial growth of CdTe on the rinsed surface of the Si(221)off substrate. The invention also provides an epitaxial growth method of CdTe on silicon by molecular beam epitaxy in which a silicon substrate is used, whose surface is rinsed for a Cd irradiation on the rinsed silicon surface and a subsequent epitaxial growth of CdTe thereon by molecular beam epitaxy. The Cd irradiation on the rinsed surface of the silicon may be carried out at a temperature in the range of from 670° C. to 750° C. Further, the Cd irradiation on the rinsed surface of the silicon is continued until an entire surface of the silicon is completely covered with CdTe in an epitaxial growth of CdTe by molecular beam epitaxy.

12 Claims, 3 Drawing Sheets

METHOD OF GROWTH OF CDTE ON SILICON BY MOLECULAR BEAM EPITAXY

BACKGROUND OF THE INVENTION

The invention relates to a method of growth of CdTe on silicon by molecular beam epitaxy.

Epitaxial growth of CdTe on a silicon substrate has a great deal of attention as high quality and large size silicon substrates may commercially be available with a relatively low cost. Si(001) substrate or Si(001)off substrate is available for CdTe growth by use of molecular beam epitaxy, which is disclosed in J. Vacuum Sci. Technol., B10 (1992) pp. 1450, "Current status of direct growth of CdTe and HgCdTe on silicon by molecular beam epitaxy" or Society of photo-optical instrumentation engineers Vol. 1512 pp. 155 1991. According to this prior arts, a thin protective oxide film is previously formed on a surface of the silicon substrate for subsequent introduction thereof into a growth chamber for epitaxial growth of CdTe. The thin protective oxide film is removed by a heat treatment at 850° C. and then the surface of the silicon substrate from which the protection oxide film was removed is subjected to a rinse. The silicon substrate is cooled down to a growth temperature of CdTe. An epitaxial growth of CdTe on silicon substrate may be carried out at a growth temperature of approximately 300° C. Alternatively, it may be available growth method that an initial growth of CdTe is carried out at a low temperature of approximately 220° C. for annealing at a temperature of approximately 360° C. and subsequent normal growth at a temperature of approximately 300° C.

A crystal quality of CdTe epitaxially grown on a Si(001) substrate depends upon a quality of the rinsed surface of the silicon substrate. As described above, the surface of the silicon substrate is, however, rinsed at the high temperature of approximately 850° C. Such a high temperature causes a degasification to be generated from a circumference of the silicon substrate. This leads to a difficulty to keep a high quality of the rinsed surface of the silicon substrate. This problem is very serious particularly when the rinse is carried out within the growth chamber for CdTe epitaxial growth since the silicon substrate is polluted with Te. In such a case, it is no longer possible to obtain a high quality crystal structure or crystal perfection.

Although it was tried to bake the growth chamber in a night for subsequent rinse treatment of the silicon substrate to combat this problem, a result thereof was in a difficulty to obtain a high quality crystal structure nor crystal perfection. Establishment of an executive cleaning room has also resulted in a difficulty to obtain a high quality crystal structure nor crystal perfection. The quality of the crystal structure may be evaluated from measurement of the full width at a half maximum (FWHM) of X-ray. In the above cases, the full width at the half maximum of X-ray is varied in the range of from several hundreds seconds to several thousands seconds. Such variations of the measured values of the full width at the half maximum of X-ray means the crystal imperfection and inferior quality of CdTe grown on the silicon substrate by molecular beam epitaxy.

The Si(001) substrate permits the CdTe(111) including a great deal of twin or twin plane to be formed thereon by use of the molecular beam epitaxy. In fact, it seems difficult to suppress any generation of the twin in grown of the CdTe(111) on the Si(001). Further, the CdTe epitaxial layer necessarily has a double domain structure in which one domain differs from the another by 90°. To obtain a high quality crystal structure or a crystal perfection of the CdTe grown on the silicon substrate, it would absolutely be required to keep the CdTe from including any twin or double domain crystal structure. Namely, to comply with this requirement, it would necessarily be required to obtain a twin free and single domain CdTe layer grown on the silicon substrate. In the prior art, although it was tried to use a Si(001)off substrate, this results in an inferior quality of the crystal structure of CdTe epitaxially grown on the silicon substrate. Such inferior crystal quality of the CdTe is caused by a large stress appearing at a step due to a large lattice mismatch of 30% between the CdTe(111) and the Si(001). Whereas use of the Si(001) or the Si(001)off may provide a reduction from 19.3% down to 3.4% in the effective lattice mismatch in <211> direction, the reduced 3.4% lattice mismatch is larger than a 0.7% lattice mismatch of CdTe(111) on GaAs(001). The reduced 3.4% lattice mismatched CdTe on the Si(001)off is, however, regarded as having a sufficient large lattice mismatch to permit a great deal of misfit dislocations to be generated on an interface between the CdTe layer and the Si substrate.

Another conventional method of the epitaxial growth of CdTe on Si substrate is disclosed in Journal of electronic materials vol. 22, pp. 951, 1993. According to this prior art, after the thin protective oxide film as formed on the silicon substrate was removed by heating up the silicon substrate, an epitaxial growth of CdTe(111)B on Si(001)off is carried out thereby resulting in 140 seconds of the full width at the half maximum of X-ray. This growth method is yet engaged with a disadvantage as to the difficulty in obtaining a high quality of a rinsed surface of the silicon substrate. As described above, a crystal quality of CdTe epitaxially grown on a Si(001) substrate depends upon a quality of the rinsed surface of the silicon substrate. To remove the protective oxide film on the silicon substrate, it is necessary to heat up the silicon substrate over 850° C. Such a high temperature causes rising a partial pressure of Te in a growth chamber for epitaxial growth of CdTe on Si substrate. The rinsed surface of the silicon substrate from which the oxide film was removed is necessarily subjected to a pollution with Te as a degasification. A CdTe growth on the Si(001) once polluted with Te results in that it is no longer possible to obtain an epitaxial growth of single crystal CdTe layers on the silicon substrate, namely an undesirable growth of CdTe(111)A on the silicon substrate. The (111)A orientation is regarded as unsuitable for CdTe growth, leading to a difficulty to obtain a single crystal structure thereof with a crystal perfection. This problem is the same as described above. In this case, it is no longer possible to obtain a high quality crystal structure or crystal perfection.

Further, it is disclosed in Applied Physics Letters Vol. 63, pp. 818, 1993 that a heating up of the silicon substrate is carried out at a temperature in the range of from approximately 400° C. to 500° C. to rinse a surface of the silicon substrate for subsequent epitaxial growth of CdZnTe(001)off over Si(001)off through a ZnTe buffer layer. The heating up temperature in the range of from 400° C. to 500° C. carried out in this prior art method is still higher than a growth temperature of CdTe in the vicinity of 300° C., while 158 seconds in the full width at the half maximum was obtained. Under this growth temperature, the problem about the pollution with Te as described above has not yet been settled. Even if the heating up temperature for cleaning is reduced down under the growth temperature for CdTe, hydrogen tends to remain on the surface of the silicon substrate. The remaining hydrogen on the silicon substrate may prevent a crystal growth of CdTe thereby resulting in an inferior crystal quality of CdTe.

Still another conventional method for epitaxial growth of CdTe on the silicon substrate is disclosed in Applied Physics 18a-SL-9, 1992. This conventional CdTe growth method utilizes a Te irradiation on the surface of the substrate at a temperature in the range of from 550° C. to 675° C. to cover the surface of the silicon with Te for subsequent CdTe epitaxial growth on the silicon substrate. This results in a growth of a CdTe with B face on Si(001). Although the previous irradiation of Te on the Si(001) permits a growth of B-face CdTe, any previous irradiation of Te on Si(221) or Si(221)off results in no crystal growth of B-face CdTe.

Yet another conventional CdTe growth method for epitaxial growth of CdTe on the silicon substrate is disclosed in the Japanese Laid-open Patent Application No. 2-150018. According to this method, a CdTe epitaxially grown on the silicon substrate is subjected to Te atoms dissociation so as to leave the Cd layer only on the silicon substrate for subsequent re-growth of CdTe on the remaining Cd layer on the silicon substrate. This method may provide a less twin CdTe epitaxially grown on the silicon substrate.

The above CdTe growth method using the Te dissociation for subsequent re-growth of CdTc is, however, engaged with the problem as to a difficulty in adhesion of Cd atoms on the silicon substrate under the CdTe growth temperature of approximately 300° C. Even at approximately 100° C. of the substrate, it is difficult to leave Cd atoms only on the silicon substrate. Although it is necessary to leave Te atoms or an impurity of heavy metal as a nuclear to permit the Cd atoms to remain on the silicon substrate, the Te atoms and the impurity of heavy metals permit a growth of CdTe with A-face namely prevents a growth of CdTe with B-face necessary to obtain a high quality crystal structure of CdTe. For obtaining a high quality crystal CdTe with B-face, it would be required to prepare a clean surface of the silicon substrate free from any other atoms such as Te and Cd.

SUMMARY OF THE INVENTION

Accordingly, it is a primary object of the present invention to provide a novel method of an epitaxial growth of CdTe on silicon by molecular beam epitaxy free from any problem as described above.

It is a further object of the present invention to provide a novel method of an epitaxial growth of CdTe on silicon by molecular beam epitaxy in which an epitaxial CdTe layer is free from twin or twin crystal structure.

It is a furthermore object of the present invention to provide a novel method of an epitaxial growth of CdTe on silicon by molecular beam epitaxy in which an epitaxial CdTe layer has a single domain crystal structure and being free from any double domain structure.

It is a still further object of the present invention to provide a novel method of an epitaxial growth of CdTe on silicon by molecular beam epitaxy in which an epitaxial CdTe layer has an interface with the silicon, which is free from any misfit dislocation due to a large lattice mismatch.

It is yet a further object of the present invention to provide a novel method of an epitaxial growth of CdTe with a crystal perfection on silicon by molecular beam epitaxy free from any conditions for a growth chamber and a rinse method.

The above and other objects, features and advantages of the present invention will be apparent from the following descriptions.

The present invention provides a novel method of an epitaxial growth of CdTe on silicon by molecular beam epitaxy, according to which a Si(221) substrate is used, whose surface is rinsed in an ultra high vacuum for a subsequent epitaxial growth of CdTe on the rinsed surface of the Si(221) substrate thereby the CdTe with crystal perfection and a single domain structure being free from any twin is obtained.

The present invention also provides another novel method of an epitaxial growth of CdTe on silicon by molecular beam epitaxy in which a Si(221) substrate but being tilted by 6° or less toward [−1 −1 4] is used, whose surface is rinsed in an ultra high vacuum for a subsequent epitaxial growth of CdTe on the rinsed surface of the Si(221)off substrate thereby the CdTe with crystal perfection and a single domain structure being free from any twin is obtained.

The present invention also provides a further novel method of an epitaxial growth of CdTe on silicon by molecular beam epitaxy in which a silicon substrate is used, whose surface is rinsed for a Cd irradiation on the rinsed silicon surface and a subsequent epitaxial growth of CdTe thereon by molecular beam epitaxy. The Cd irradiation on the rinsed surface of the silicon may be carried out at a temperature in the range of from 670° C. to 750° C. Further, the Cd irradiation on the rinsed surface of the silicon is continued until an entire surface of the silicon is completely covered with CdTe in an epitaxial growth of CdTe by molecular beam epitaxy.

BRIEF DESCRIPTION OF THE DRAWINGS

Preferred embodiments of the present invention will hereinafter be described in detail with reference to the accompanying drawings.

DESCRIPTIONS OF THE INVENTION

Figure 1:
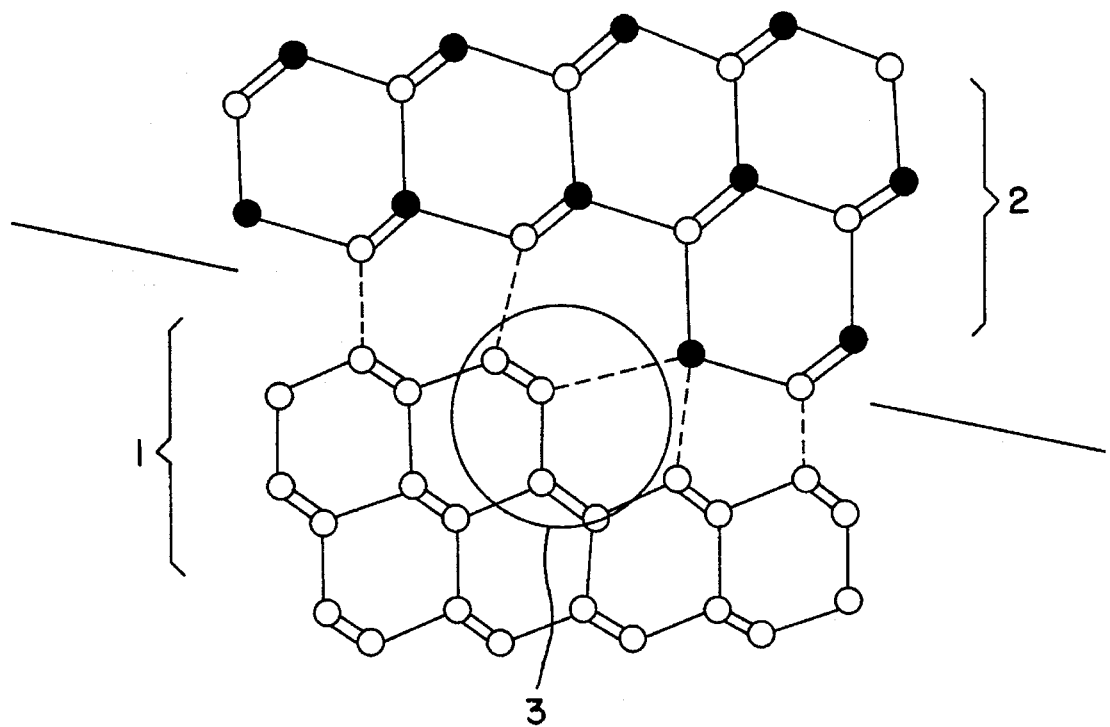
FIG. 1 is a view illustrative of crystal structures of CdTe(112)off on Si(221)off in which a stress due to a lattice mismatching between them is reduced according to the present invention.

The present invention provides a novel method of an epitaxial growth of CdTe on silicon by molecular beam epitaxy in which a Si(221) substrate or a Si(221) substrate being tilted by 6° or less toward [−1 −1 4] is used, whose surface is rinsed in an ultra high vacuum for a subsequent epitaxial growth of CdTe on the rinsed surface of the Si(221)off substrate. The (221) oriented surface includes a plurality of (111) oriented terraces and steps. The growth of the (112) oriented surface on the (221) oriented surface causes atomic bonding between CdTe and Si to have a displacement by two times of a distance $d_{422}$ of Si(422). Since the lattice mismatch between the CdTe and Si is 19.3%, it would be required to select such an orientation as to permit a distance of the steps to be equal to $D_{422}/0.193$ thereby no lattice mismatch appears in a vertical direction to the steps as illustrated in FIG. 1.

Figure 2:
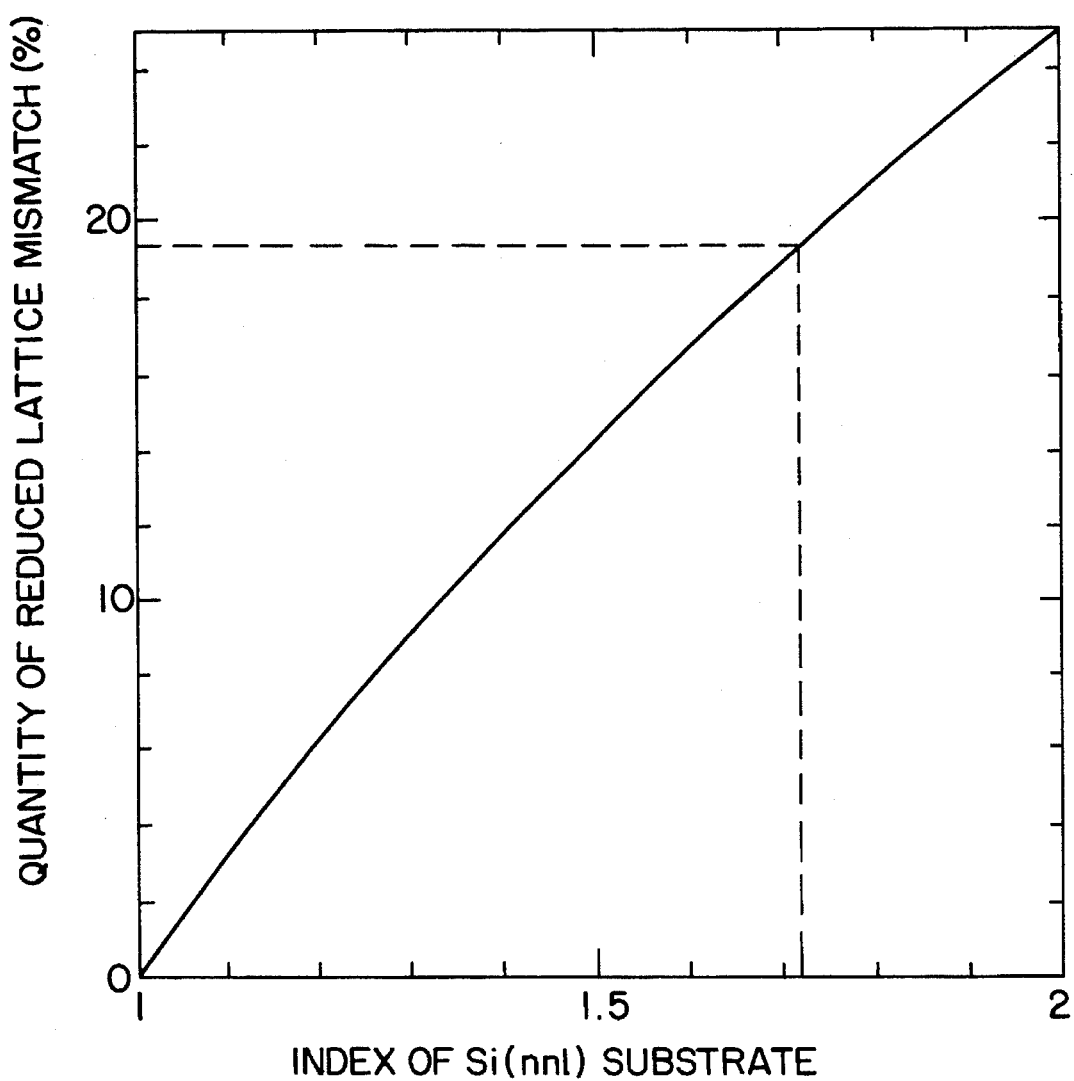
FIG. 2 is a diagram illustrative of an amount of a stress relaxation versus index n of Si(nn1)off for lattice mismatching between CdTe(112)off on Si(nn1)off according to the present invention.

FIG. 2 illustrates an amount of a stress relaxation versus index n of Si(nn1)off for lattice mismatching between CdTe(112)off on Si(nn1)off, from which it could be appreciated that the Si(221) tilted 3° toward [−1 −1 4] is optimum for the epitaxial growth of CdTc(112)off. Also it was confirmed that the CdTe(112)off is suitable to suppress any generation of crystal twin.

The CdTe(112)off with a crystal perfection is also available as a substrate or a buffer layer on which HgCdTe layer is grown and usable for infrared sensors.

A preferred embodiment of the above invention will subsequently be described, according to which a Si(221) substrate tilted 3° toward [−1 −1 4] is used for the epitaxial growth of CdTe. The Si(221) substrate tilted 3° toward [−1 −1 4] is washed by a RCA washing method disclosed in RCA Review 31 pp. 187 1970 for subsequent introduction thereof into a preheating room in which heating up the silicon substrate up to a temperature of approximately 850° C. is carried out to remove a protection oxide film from the surface of the tilted silicon substrate before the surface of the silicon substrate is rinsed for introduction thereof into a growth chamber. The growth chamber was maintained at a predetermined temperature of 200° C. until a molecular beam epitaxy for CdTe is completed, resulting in an epitaxial growth of a CdTe(112) tilted 5° toward [1 1 −1].

Alternatively, the growth chamber was maintained at 250° C. until a molecular beam epitaxy for CdTe is completed, also resulting in an epitaxial growth of a CdTe(112) tilted 5° toward [1 1 −1]. Further, the growth chamber was maintained at 300° C. until a molecular beam epitaxy for CdTe is completed, also resulting in an epitaxial growth of a CdTe(112) tilted 5° toward [1 1 −1]. Furthermore, the growth chamber was maintained at 350° C. until a molecular beam epitaxy for CdTe is completed, also resulting in an epitaxial growth of a CdTe(112) tilted 5° toward [1 1 −1].

Alternatively, the growth chamber was maintained at a predetermined temperature of 200° C. until a CdTe(112) tilted 5° toward [1 1 −1] is grown up to a thickness of 500 angstroms on the Si(221) substrate tilted 3° toward [−1 −1 4]. An annealing is subsequently carried out at a temperature 400° C. for ten minutes without irradiating any molecular beam before an epitaxial re-growth of CdTe(112) tilted 5° toward [1 1 −1] on the grown CdTe layer having the thickness of 500 angstroms. In this case, the x-ray full width at the half maximum being 220 seconds was obtained. This proves that the obtained CdTe(112) tilted 5° toward [1 1 −1] has a perfect crystal structure of a single domain structure without any twin crystal.

The present invention also provides a novel method of an epitaxial growth of CdTe on Si substrate by use of molecular beam epitaxy. A surface of a silicon substrate is rinsed for a Cd irradiation on the rinsed silicon surface and a subsequent epitaxial growth of CdTe thereon by molecular beam epitaxy. The Cd irradiation on the rinsed surface of the silicon may be carried out at a temperature in the range of from 670° C. to 750° C. Further, the Cd irradiation on the rinsed surface of the silicon is continued until an entire surface of the silicon is completely covered with CdTe in an epitaxial growth of CdTe by molecular beam epitaxy.

This novel growth method may have the silicon substrate be free from a possibility of the pollution with Te or other heavy metals. From the past observation of the surface of the silicon substrate by use of a X-ray photoelectric stectroscope (XPS), it was confirmed that a Cd irradiation on the rinsed surface of the silicon substrate results no adhesion of Cd atoms thereon. It may thus be appreciated that Te atoms would initially show an adhesion on the rinsed surface of the silicon substrate. Heating up the silicon surface covered with Te atoms to a high temperature in the range of from 670° C. to 750° C. results in a Te atom dissociation, which was confirmed by the reflection high energy electron diffraction (RHEED) and the X-ray photoelectric stectroscope (XPS). Under 670° C., the Te atoms show the adhesion on the silicon substrate, resulting in that a broad pattern of the RHEED is obtained. At a temperature in the range of from 670° C. to 750° C., a sharp pattern of the RHEED is obtained as well as a measurement of the surface of the silicon substrate by the XPS method has detected none of Te atoms indicating that the Te atom dissociation appears. Over 750° C., the HREED pattern is spotty as the Te atoms are bonded with Si atoms.

The Cd irradiation carried out in the range of temperature at which the Te atoms show dissociation results in a considerable reduction of a pollution with Te due to a reduction of a partial pressure of Te atoms which is cased by bonding the Te atoms with Cd atoms adhered on a wall peripheral to the silicon substrate as well as due to a promotion of the Te atom dissociation by the Cd atoms. From the above, it could be understood that the Cd irradiation at the temperature in the range of from 670° C. to 750° C. may prevent the surface of the silicon substrate from any pollution with Te atoms.

When a Si(221) or a Si(221)off is used, the oriented (221) surface includes (111) oriented terraces and steps in which Te atoms tend to be bonded into the steps while the Cd atoms tend to be bonded to the (111) oriented terrace so that the terrace becomes B-terrace. When the rinsed surface of the silicon substrate is subjected to a Te atmosphere, the Te atoms tend to be bonded not only to the step but also the terrace. Thus, an epitaxial growth of CdTe in the above circumstance results in a CdTe with A-face or with antiphase domain. To obtain a growth of B-face CdTe. it would therefore be required that the surface of the silicon substrate is free from any bonding with Te atoms in an initial growth except in the step regions. This agrees with the experimental results as described above that the Te irradiation causes a growth of the A-faced CdTe.

According to the experimental results as described above, the bonding of Te atoms on the silicon surface is previous to the bonding of Cd atoms thereon. In the initial stage of the growth, it is necessary that the Te atoms bonded to the steps of the silicon surface serve as nuclear which permits the Cd atoms to be bonded on the terrace. It is also necessary to prevent any extra Te atoms to be bonded on the silicon surface at least until every terraces are completely covered with the Cd atoms. For that purpose, the Cd irradiation is continued still after the CdTe epitaxial growth is commenced, at least until any terraces of the silicon surface is covered with the Cd atoms. It could readily be confirmed by use of the RHEED method whether any terraces of the silicon surface is covered with Cd atoms while the steps thereof are covered by Te atoms. Further, it was confirmed that the Cd irradiation on a Si(001) substrate or a Si(001)off substrate also permits the epitaxial growth of CdTe with B-face similarly to the above case in which the Si(221) substrate.

Figure 3:
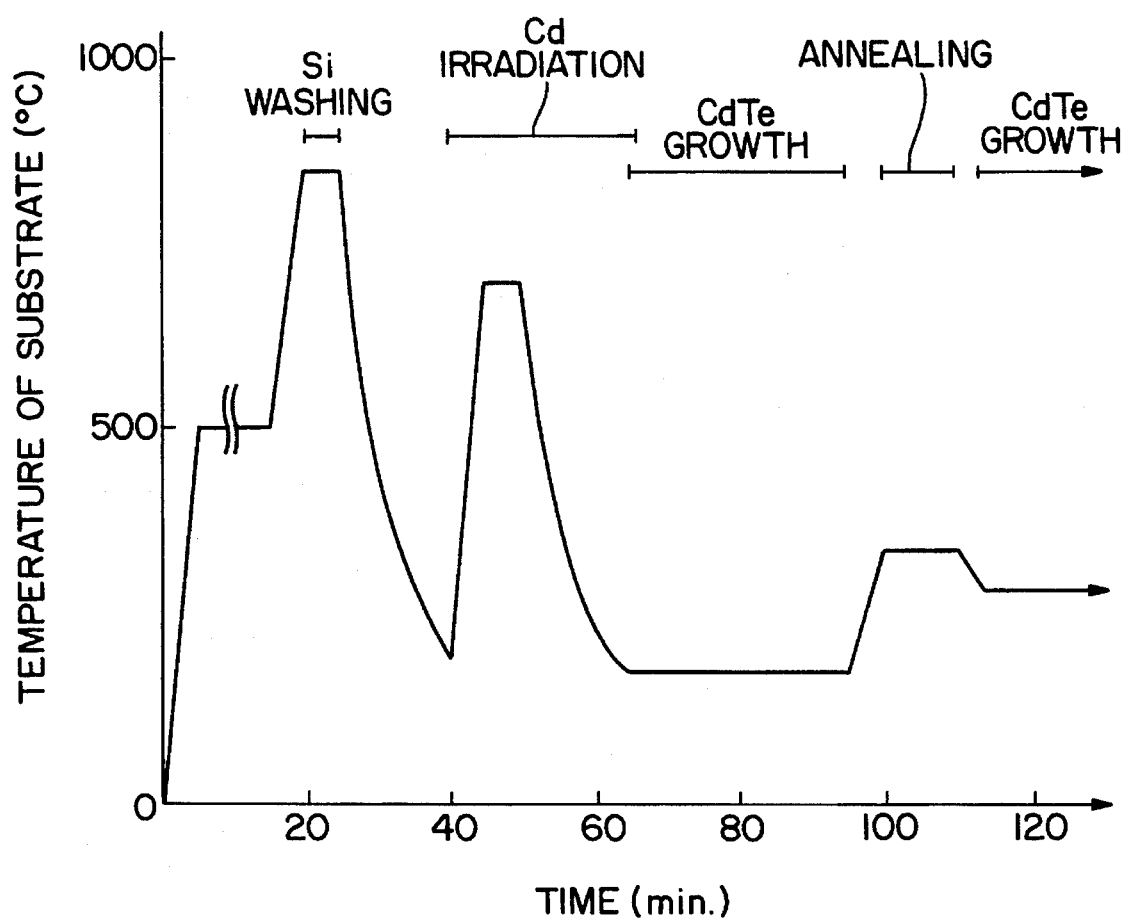
FIG. 3 is a diagram illustrative of a process of growing a CdTe layer on a silicon substrate according to the present invention.

A preferred embodiment of the above invention will be described with reference to FIG. 3 illustrating a growth process for CdTe con silicon. A Si(221) substrate tilted 3° toward [−1−1 4] is used for an epitaxial growth of CdTe by molecular beam epitaxy. The silicon substrate is subjected to a RCA rinse treatment for introduction thereof into a growth chamber in which the rinsed silicon substrate is subsequently placed in an ultra high vacuum at a temperature of 500° C. for a few hours. Thereafter, the silicon substrate is placed at a high temperature of 850° C. for five minutes to remove a protective oxide film from the surface of the silicon substrate. The silicon substrate is then cooled down to 200° C. to be exposed to an irradiation of Cd atoms at an exposure quantity of $1 \times 10^{-6}$ torr in reduced pressure. The Cd irradiation on the silicon substrate is further continued, until the silicon substrate is heated up to 700° C. to be held at this temperature for five minutes. The Cd irradiation is furthermore continued until the silicon substrate is cooled down to 180° C. for a first epitaxial growth of CdTe thereon by molecular beam epitaxy of CdTe molecules at an exposure quantity of $1 \times 10^{-7}$ torr in reduced pressure. The above Cd atom irradiation is still further continued until one minute after the CdTe epitaxial growth is commenced. The CdTe epitaxial growth by molecular beam epitaxy is carried out at the temperature of 180° C. for 30 minutes for subsequent annealing process heating up the same to 340° C. for ten minutes. The silicon substrate is then cooled down to 290° C. at which a re-growth of CdTe is carried out until a thickness of the CdTe layer reaches 5 micrometers. It was confirmed that the obtained CdTe crystal structure shows the x-ray full width at the half maximum of 121 seconds which indicates that the resultant CdTe epitaxial layer has a twin free crystal structure and a crystal perfection.

Alternatively, it was confirmed that the same growth process as described above utilizing the Cd atom irradiation is also applicable to an epitaxial growth of CdTe on either a Si(001) substrate and a Si(222) substrate. Namely, the silicon substrate is subjected to the RCA rinse treatment for introduction thereof into the growth chamber in which the rinsed silicon substrate is subsequently placed in the ultra high vacuum at a temperature of 500° C. for a few hours. Thereafter, the silicon substrate is placed at a high temperature of 850° C. for five minutes to remove a protective oxide film from the surface of the silicon substrate. The silicon substrate is then cooled down to 200° C. to be exposed to an irradiation of Cd atom at an exposure quantity of $1 \times 10^{-6}$ torr in reduced pressure. The Cd irradiation on the silicon substrate is further continued, until the silicon substrate is heated up to 700° C. to be held at this temperature for five minutes. The Cd irradiation is furthermore continued until the silicon substrate is cooled down to 180° C. for a first epitaxial growth of CdTe thereon by molecular beam epitaxy of CdTe molecules at an exposure quantity of $1 \times 10^{-7}$ toor in reduced pressure. The above Cd atom irradiation is still further continued until one minute after the CdTe epitaxial growth is commenced. The CdTe epitaxial growth by molecular beam epitaxy is carried out at the temperature of 180° C. for 30 minutes for subsequent annealing process heating up the same to 340° C. for ten minutes. The silicon substrate is then cooled down to 290° C. at which a re-growth of CdTe is carried out until a thickness of the CdTe layer reaches 5 micrometers. It was confirmed that the obtained CdTe crystal structure shows the x-ray full width at the half maximum of 121 seconds which indicates that the resultant CdTe epitaxial layer has a twin free crystal structure and a crystal perfection.

Whereas modifications of the present invention will no doubt be apparent to a person having ordinary skill in the art to which the invention pertains it is to be understood that the embodiments shown and described by way of illustrations are by no means intended to be considered in a limiting since. Accordingly, it is to be intended to cover by claims all modifications of the invention which fall within the spirit and scope of the invention.

What is claimed is:

1. A method of growing CdTe on silicon by molecular beam epitaxy comprising the steps of:

preparing a Si(221) substrate tilted by an angle in the range from 0° to 6° toward [−1−1 4];

cleaning a surface of said Si(221) substrate in an ultra high vacuum; and epitaxially growing CdTe on said Si(221) substrate.

2. The method as claimed in claim 1, wherein said angle for tilting is 3°.

3. The method as claimed in claim 1, wherein said cleaning process is carried out by an RCA method.

4. A method of growing CdTe on silicon by molecular beam epitaxy comprising the steps of:

preparing a Si(221) substrate tilted by an angle in the range from 0° to 6° toward [−1−1 4];

cleaning a surface of said Si(221) substrate by use of an RCA method;

heating up said Si(221) substrate to a temperature of approximately 850° C. to remove a protective oxide film from said substrate;

introducing said Si(221) substrate into a growth chamber;

cooling down said Si(221) substrate to a temperature in the range of from 200° C. to 350° C.; and epitaxially growing CdTe on said Si(221) substrate so that a CdTe(112) layer tilted by 5° toward [1 1−1] is grown on said Si(221) substrate.

5. A method of growing CdTe on silicon by molecular beam epitaxy comprising the steps of:

preparing a Si(221) substrate tilted by an angle in the range from 0° to 6° toward [−1−1 4];

cleaning a surface of said Si(221) substrate by use of an RCA method;

heating up said Si(221) substrate to a temperature of approximately 850° C. to remove a protective oxide film from said substrate;

introducing said Si(221) substrate into a growth chamber;

cooling down said Si(221) substrate to a temperature of 200° C.;

epitaxially growing CdTe on said Si(221) substrate until a CdTe(112) layer tilted 5° toward [1 1−1] having a thickness of 500 angstroms is grown on said Si(221) substrate;

subjecting said Si(221) substrate with said CdTe(112) layer to an annealing at a temperature of 400° C. for ten minutes without any exposure of CdTe; and epitaxially re-growing CdTe on said CdTe(112) layer on said Si(221) substrate.

6. A method of growing CdTe on silicon by molecular beam epitaxy comprising the steps of:

cleaning a silicon substrate to remove a protective oxide film from said silicon substrate;

exposing a surface of said silicon substrate to an irradiation of Cd atoms to have said Cd atoms cover terraces involved in said surface of said silicon substrate; and an epitaxial growth of CdTe on said surface of said silicon substrate.

7. The method as claimed in claim 6, wherein said silicon substrate is a Si(221) substrate tilted by 3° toward [−1−1 4].

8. The method as claimed in claim 6, wherein said Cd irradiation is carried out at a temperature in the range of from 180° C. to 200° C.

9. A method of growing CdTe on silicon by molecular beam epitaxy comprising the steps of:

cleaning a silicon substrate to remove a protective oxide film from said silicon substrate;

exposing a surface of said silicon substrate to an irradiation of Cd atoms to have said Cd atoms cover terraces involved in said surface of said silicon substrate;

an initial epitaxial growth of CdTe on said surface of said silicon substrate with said exposure of Cd; and discontinuing said exposure process for a subsequent epitaxial re-growth of CdTe.

10. The method as claimed in claim 9, wherein said silicon substrate is a Si(221) substrate tilted by 3° toward [−1−1 4].

11. The method as claimed in claim 9, wherein said Cd irradiation is carried out at a temperature in the range of from 180° C. to 200° C.

12. A method of growing CdTe on silicon by molecular beam epitaxy comprising the steps of:

preparing a Si(221) substrate tilted by 3° toward [−1−1 4];

cleaning a surface of said Si(221) substrate by use of an RCA method;

placing said Si(221) substrate in an ultra high vacuum at a temperature of 500° C. for a few hours;

heating up said Si(221) substrate to a temperature of approximately 850° C. for five minutes to remove a protective oxide film from said substrate;

cooling down said Si(221) substrate to a temperature of 200° C.;

exposing a surface of said Si(221) substrate to an irradiation of Cd atoms with an exposure quantity of $1\times10^{-6}$ torr;

heating up said Si(221) substrate to a temperature of 700° C. for five minutes together with said exposure process;

cooling down said Si(221) substrate to a temperature of 180° C.;

epitaxially growing CdTe on said Si(221) substrate for one minute together with said Cd exposure process;

continuing said CdTe epitaxial growth for thirty minutes without said Cd exposure process;

subjecting said Si(221) substrate with said CdTe(112) layer to an annealing at a temperature of 340° C. for ten minutes without any exposure of CdTe; and epitaxially re-growing CdTe on said CdTe(112) layer on said Si(221) substrate at a temperature of 290° C.

\* \* \* \* \*